US 7,365,029 B2

(12) United States Patent
Iyer et al.

(10) Patent No.: US 7,365,029 B2
(45) Date of Patent: Apr. 29, 2008

(54) METHOD FOR SILICON NITRIDE CHEMICAL VAPOR DEPOSITION

(75) Inventors: R. Suryanarayanan Iyer, Santa Clara, CA (US); Sean M. Seutter, San Jose, CA (US); Sanjeev Tandon, Sunnyvale, CA (US); Errol Antonio C. Sanchez, Tracy, CA (US); Shulin Wang, Campbell, CA (US)

(73) Assignee: Applied Materials, Inc., Santa Clara, CA (US)

(*) Notice: Subject to any disclaimer, the term of this patent is extended or adjusted under 35 U.S.C. 154(b) by 378 days.

(21) Appl. No.: 11/152,501

(22) Filed: Jun. 14, 2005

(65) Prior Publication Data

US 2005/0255714 A1   Nov. 17, 2005

Related U.S. Application Data

(63) Continuation-in-part of application No. 10/741,417, filed on Dec. 19, 2003, which is a continuation-in-part of application No. 10/327,467, filed on Dec. 20, 2002, now Pat. No. 7,172,792.

(60) Provisional application No. 60/435,813, filed on Dec. 20, 2002.

(51) Int. Cl.
*H01L 21/31* (2006.01)
*H01L 21/469* (2006.01)

(52) U.S. Cl. ............... 438/793; 438/794; 257/E21.293

(58) Field of Classification Search ............... 438/793, 438/794
See application file for complete search history.

(56) References Cited

U.S. PATENT DOCUMENTS 4,158,717 A   6/1979   Nelson (Continued)

FOREIGN PATENT DOCUMENTS

JP   62-051264   3/1987
JP   04-365379   12/1992

OTHER PUBLICATIONS

Scuh et al, Disilanyl-amines- Compounds Comprising the Structural Unit Si-Si-N as Single Source Precursors for Plasma Enhanced Chemical Vapor Deposition (PE-CVD) of Silicon Nitride Z. Anorg. Allg. Chem. vol. 619 (1993) pp. 1347-1352.*

(Continued)

Primary Examiner—Alexander Ghyka
(74) Attorney, Agent, or Firm—Patterson & Sheridan, LLP (57) ABSTRACT

Embodiments of the invention generally provide a method for depositing a film containing silicon (Si) and nitrogen (N). In one embodiment, the method includes heating a substrate disposed in a processing chamber to a temperature less than about 650 degrees Celsius, flowing a nitrogen-containing gas into the processing chamber, flowing a silicon-containing gas into the processing chamber, and depositing a SiN-containing layer on a substrate. The silicon-containing gas is at least one of a gas identified as $NR_2$—$Si(R'_2)$—$Si(R'_2)$—$NR_2$ (amino(di)silanes), $R_3$—Si—N=N=N (silyl azides), $R'_3$—Si—NR—$NR_2$ (silyl hydrazines) or 1,3,4,5,7,8-hexamethytetrasiliazane, wherein R and R' comprise at least one functional group selected from the group of a halogen, an organic group having one or more double bonds, an organic group having one or more triple bonds, an aliphatic alkyl group, a cyclical alkyl group, an aromatic group, an organosilicon group, an alkyamino group, or a cyclic group containing N or Si.

11 Claims, 3 Drawing Sheets

U.S. PATENT DOCUMENTS

| | | | |
|---|---|---|---|
| 4,857,140 | A | 8/1989 | Loewenstein |
| 4,992,299 | A | 2/1991 | Hochberg et al. |
| 4,992,306 | A | 2/1991 | Hochberg et al. |
| 5,273,920 | A | 12/1993 | Kwasnick et al. |
| 5,380,566 | A | 1/1995 | Robertson et al. |
| 5,562,952 | A | 10/1996 | Nakahigashi et al. |
| 5,591,494 | A | 1/1997 | Sato et al. |
| 5,632,821 | A | 5/1997 | Doi |
| 6,224,950 | B1 | 5/2001 | Hirata |
| 6,303,777 | B1 | 10/2001 | Kao et al. |
| 6,324,439 | B1 | 11/2001 | Cheung et al. |
| 6,348,420 | B1 | 2/2002 | Raaijmakers et al. |
| 6,413,887 | B1 | 7/2002 | Fukuda et al. |
| 6,420,282 | B1 * | 7/2002 | Batey et al. ............... 438/792 |
| 6,468,903 | B2 | 10/2002 | Bolscher et al. |
| 6,524,955 | B2 | 2/2003 | Fukuda et al. |
| 6,544,900 | B2 | 4/2003 | Raaijmakers et al. |
| 6,555,183 | B2 | 4/2003 | Wang et al. |
| 6,583,046 | B1 | 6/2003 | Okada et al. |
| 6,586,163 | B1 | 7/2003 | Okabe et al. |
| 6,630,413 | B2 | 10/2003 | Todd |
| 7,172,792 | B2 * | 2/2007 | Wang et al. ........... 427/255.393 |

OTHER PUBLICATIONS

Kitoh et al, Formation of SiN Films by Plasma Enhanced Chemical Vapor Deposition Using ((CH3)2N)3SiN3, Jpn. J. App. Phys. vol. 33 (1994), pp. 7076-7079.*

Smirnova et al, Silicon Carbonitride Films as New Materials Obtained by Plasma Chemical Vapor Deposition from Novel Precursor, Proceedings of SPIE, vol. 4467 (2001), pp. 366-376.*

Tanaka, et al. "Film Properties of Low-κSilicon Nitride Films Formed by Hexachlorodisilane and Ammonia", J. Electrochemical Soc., vol. 147 (2000) pp. 2284-2289.

Ishihara, et al. "Low-Temperature Chemical Vapor Deposition of Silicon Nitride Using a New Source Gas (Hydrogen Azide)" Jpn. J. Appl. Phys., vol. 31 (1992) pp. L74-L77.

Ishihara, et al. "Low-Temperature Chemical-Vapor-Deposition of Silicon-Nitride from Tetra-Silane and Hydrogen Azide" Mat. Res. Soc. Symp. Proc., vol. 284 (1993) pp. 3-8.

Yeh, et al. "Low-Temperature Chemical-Vapor-Deposition of Silicon-Nitride Film from Hexachloro-Disilane and Hydrazine" Jpn. J. Appl. Phys., vol. 35 (1996) pp. 1509-1512.

Yoshioka, et al. "Deposition of Silicon Nitride Films by Silane-Hydrazine Process" J. Electrochem. Soc., vol. 114, No. 9 (1967) pp. 962-964.

Laxman, et al. "A Low Temperature Solution for Silicon Nitride Deposition" Solid State Technology, vol. 43 (2000) pp. 79, 80, 82 and 87.

Gordon, et al. "Silicon Dimethylamido Complexes and Ammonia as Precursors for Atmospheric Pressure Chemical Vapor Deposition of Silicon Nitride Thin Films" Chem. Mater. vol. 2 (1990) pp. 480-482.

Levy, et al. "Low Pressure Chemical Vapor Deposition of Silicon Nitride Using the Environmentally Benign Precursor Tris(dimethylamino)silane" Electrochemical Society Proceedings, vol. 96-5 (1996) pp. 239-246.

Yacoubi, et al. "Analysis and Modeling of Low Pressure CVD of Silicon Nitride from a Silane-Ammonia Mixture" J. Electrochemical Society, vol. 146 (1999) pp. 3009-3017.

Stüger, et al. "Aminochlorodisilanes: Precursors to Multifunctionalized Disilane Derivative" J. Organometallic Chem. vol. 547 (1997) pp. 227-233.

Tamao, et al. "Coupling of (Amino)alkylchlorosilanes with Lithium: New Access to Symmetrical Di- and Tetrafunctional Alkyldisilanes" Organomettalics, vol. 12 (1993) pp. 580-582.

Huber, et al. "Hexa(amino)disilanes With Saturated Cyclic Amino Ligands" Chemical Monthly, vol. 130 (1999) pp. 133-138.

Schuh, et al. "Disilany-amines—Compounds Comprising the Structural Unit Si-Si-N, as Single Source Precursors for Plasma-Enhanced Chemical Vapour Deposition (PE-CVD) of Silicon Nitride" Z. Anorg. Allg. Chem., vol. 619 (1993) pp. 1347-1352.

Wheeler, et al. "Aminodisilanes as Silylating Agents for Dry-Developed Positive-Tone Resists for Deep Ultraviolet (248nm) and Extreme Ultraviolet (13.5) Microlithography" Proceedings of the SPIE, vol. 2438 (1995) pp. 762-774.

Kitoh, et al. "Formation of SiN Films by Plasma-Enhanced Chemical Vapor Deposition Using $[(CH_3)_2N]_3SiN_3$," Jpn. J. App. Phys., vol. 33 (1994) pp. 7076-7079.

Smirnova, et al. "Silicon Carbonitride Films as New Materials Obtained by Plasma Chemical Vapor Deposition from Novel Precursor" Proceedings of SPIE, vol. 4467 (2001) pp. 366-376.

Klingebiel, et al. "Cyclization and Isomerization Reactions in Silylhydrazine Chemistry" Chemical Monthly, vol. 132 (2001) pp. 1105-1124.

European Examination Report for European Application No. 03813046.4 dated Nov. 21, 2006.

Matsumura, et al. "Low-temperature chemical-vapor deposition of amorphous semiconductors and insulators," Material Research Society, vol. 297, 1993, pp. 109-120.

* cited by examiner

METHOD FOR SILICON NITRIDE CHEMICAL VAPOR DEPOSITION

This application is a continuation-in-part of U.S. patent application Ser. No. 10/741,417, filed Dec. 19, 2003, which is a continuation-in-part of U.S. patent application Ser. No. 10/327,467, filed Dec. 20, 2002 now U.S. Pat. No. 7,172,792 that claims benefit of U.S. Provisional Patent Application Ser. No. 60/435,813, filed Dec. 20, 2002, all of which are herein incorporated by reference in their entireties.

BACKGROUND OF THE INVENTION

1. Field of the Invention

Embodiments of the invention generally relate to methods for depositing materials containing silicon (Si) and nitrogen (N), and more particularly, embodiments of the invention relate to chemical vapor deposition techniques for thermally depositing SiN materials.

2. Description of the Related Art

Thermal chemical vapor deposition (CVD) of silicon-containing films, such as silicon nitride, is a state of the art, front end process used during semiconductor device manufacturing. For example, in a thermal CVD process for depositing silicon nitride, thermal energy is utilized for breaking one or more feedstock chemicals, which includes a silicon precursor, to make a thin film of a silicon nitride on a substrate surface. Conventional thermal CVD of SiN-containing materials is typically performed in a batch furnace or in a single wafer deposition chamber operating at elevated processing temperatures. As device geometries shrink to enable faster integrated circuits, the thermal budget for deposited films must be reduced in order to obtain avoid device damage, satisfactory processing results, good production yield and robust device performance. Although some CVD processes for SiN-containing materials having deposition temperatures less than 650 degrees Celsius have been proposed, no thermal-only (i.e., no plasma or photon assisted processes) have exhibited production worthiness suitable for large scale utilization in semiconductor device fabrication.

Thus, there is a need for a method of depositing SiN-containing materials, such as silicon nitride and silicon oxynitride, at a temperature less than about 650 degrees Celsius.

SUMMARY OF THE INVENTION

Embodiments of the invention generally provide a method for depositing a film containing silicon (Si) and nitrogen (N). In one embodiment, a method for depositing a SiN-containing layer on a substrate includes heating a substrate disposed in a processing chamber to a temperature less than about 650 degrees Celsius, flowing a nitrogen-containing gas into the processing chamber, flowing a silicon-containing gas into the processing chamber, and depositing a SiN-containing layer on a substrate. The silicon-containing gas is at least one of a gas identified as $NR_2$—$Si(R'_2)$—$Si(R'_2)$—$NR_2$ (amino (di)silanes), $R_3$—Si—N=N=N (silyl azides), $R'_3$—Si—NR—$NR_2$ (silyl hydrazines) or 1,3,4,5,7,8-hexamethytetrasiliazane, wherein R and R' comprise at least one functional group selected from the group of a halogen, an organic group having one or more double bonds, an organic group having one or more triple bonds, an aliphatic alkyl group, a cyclical alkyl group, an aromatic group, an organosilicon group, an alkyamino group, or a cyclic group containing N or Si.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that some elements of one embodiment may be beneficially incorporated in other embodiments.

DETAILED DESCRIPTION

Embodiments of the invention provide a method for depositing a silicon-containing layer, such as silicon nitride and the like, on a substrate utilizing temperatures less than about 650 degrees Celsius. Although the invention is described with reference to a single wafer thermal-chemical vapor deposition (processing) chamber 100 illustrated in FIG. 1, it is contemplated that the method may be beneficially practiced in other deposition systems, including batch deposition systems. One processing chamber in which the silicon nitride deposition process may be performed is a SiNgen® or SiNgenPlus® chamber, available from Applied Materials, Inc., of Santa Clara, Calif. Examples of other systems which may be adapted to practice the invention include the TELFORMULA batch furnace available from Tokyo Electron Limited; the FLEXSTAR® mini-batch silicon deposition system available from Applied Materials, Inc.; and the EPSILON® Single-Wafer Epitaxial Reactors from ASM International N.V., among others.

Besides thermal-CVD, other useful processes to deposit silicon nitride materials include pulsed-CVD and atomic layer deposition (ALD). During a pulsed-CVD process, reagents, such as a silicon precursor and a reactant, are co-flowed and pulsed into the process chamber. During an ALD process, reagents, such as a silicon precursor and a reactant, are individually and sequentially pulsed into the process chamber. Plasma enhanced deposition techniques may be used during either ALD or CVD processes. SiN-containing materials may be deposited to a single substrate or a batch of substrates during the deposition processes described herein.

Figure 1:
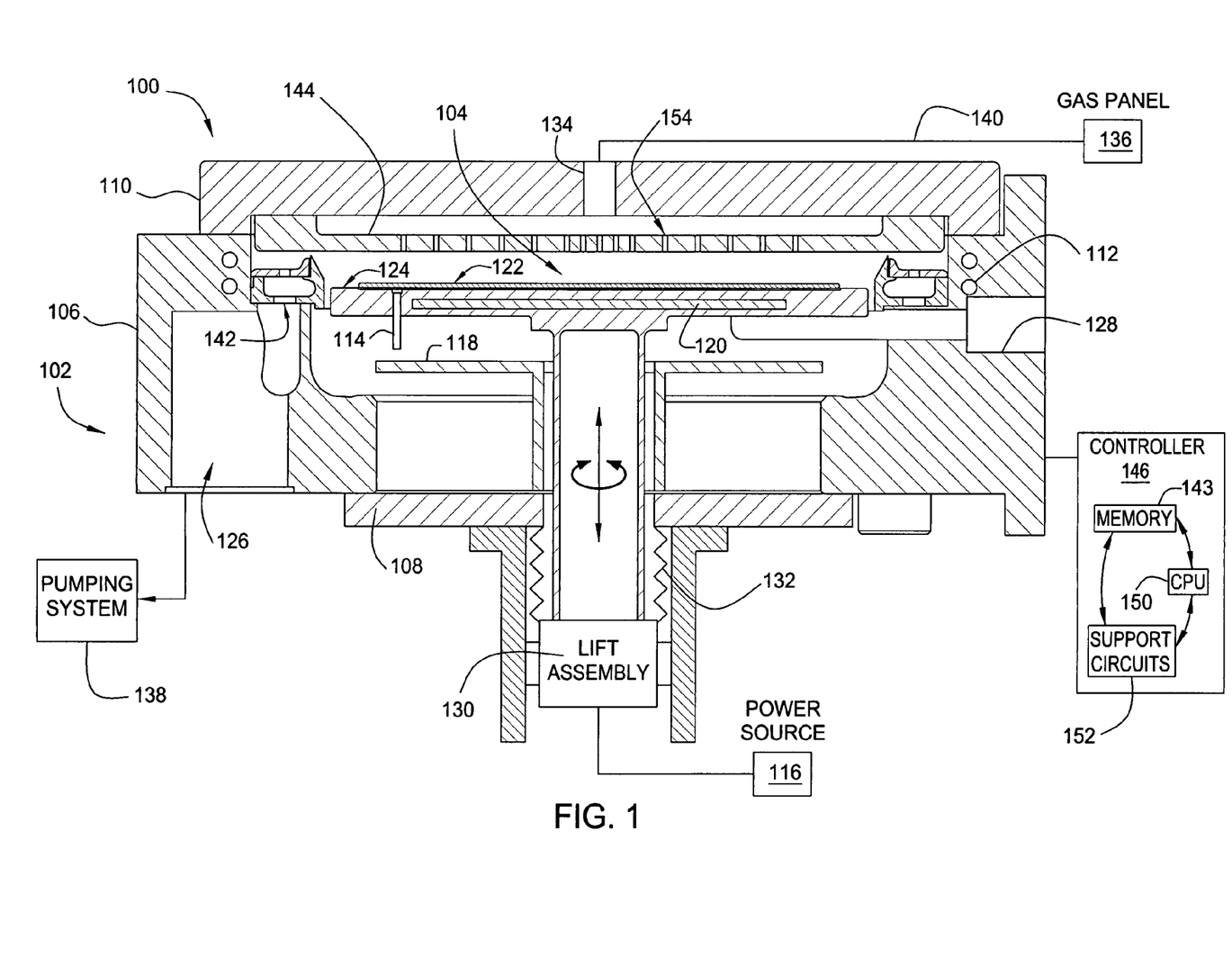
FIG. 1 is a simplified cross sectional view of one embodiment of a deposition chamber in which a method of depositing silicon nitride of the present invention may be performed.

In the embodiment of FIG. 1, the processing chamber 100 includes a chamber body 102 coupled to a pumping system 138, a controller 146, and a gas panel 136. The chamber body 102 has walls 106, a bottom 108, and a lid 110 that define an internal volume 104. The walls 106 of the body 102 may be thermally regulated. In one embodiment, a plurality of conduits 112 are disposed in the walls 106 and are configured to circulate a heat transfer fluid that regulates the temperature of the chamber body 102. The walls 106 additionally include a substrate access port 128 configured to facilitate entry and egress of a workpiece, such as a substrate 122, from the processing chamber 100.

A substrate support pedestal 124 is disposed in the internal volume 104 of the chamber body 102 and supports the substrate 122 during processing. The substrate support pedestal 124 includes a heater 120 configured to regulate the temperature of the substrate 122 and/or heat the interior volume 104 of the processing chamber 100. In the embodiment depicted in FIG. 1, the heater 120 is a resistive heating element coupled to a power source 116 and is capable of heating the substrate to a temperature of at least 550 degrees Celsius.

A pedestal lift assembly 130 is coupled to the substrate support pedestal 124 and is configured to control the elevation of the pedestal 124 between an elevated processing position (as shown in FIG. 1) and a lowered position that facilitates access to the substrate 122 disposed on the pedestal 124 through the substrate access port 128. The pedestal lift assembly 130 is sealingly coupled to the bottom 108 of the chamber body 102 by a flexible bellows 132. Optionally, the pedestal lift assembly 130 may be configured to rotate the pedestal 124 during processing.

The gas panel 136 is coupled to the processing chamber 100 and is configured to provide process and other gases to the internal volume 124 of the chamber body. In the embodiment depicted in FIG. 1, the gas panel 136 is coupled by a gas line 140 to an inlet port 134 formed in the lid 110 of the chamber body 102. It is contemplated that the inlet port 134 may be formed through one or more other locations of the chamber body 102.

A showerhead 144 is coupled to the chamber body 102 to enhance the uniform distribution of gases provided by the gas panel 136 into the internal volume 104 of the processing chamber 100. The showerhead 144 includes a perforated region 154. The holes formed in the perforated region 154 are configured in size, geometry, number and distribution as to provide a predefined flow distribution of gases passing through the showerhead 144 to the substrate 122.

Lift pins 114 (of which one is shown in FIG. 1) are provided to separate the substrate 122 from the upper surface of the substrate support pedestal 124 to facilitate substrate hand-off with a robot (not shown) entering the chamber body through the access port 128. In the embodiment depicted in FIG. 1, a lift plate 118 is disposed below the substrate support pedestal 124 and arranged such that as the pedestal 124 is lowered, the lift pins 114 come in contact with the lift plate 118 before the pedestal 124 has completed its downward travel. The lift plate 118 supports the lift pins 114 as the pedestal 124 continues downward, causing the lift pins 114 to extend from the upper surface of the pedestal. The position of the lift plate 118 and/or the length of the lift pins 114 are configured such that the substrate 122 becomes spaced-apart from the substrate support pedestal 124 and generally aligned with the access port 128 when the pedestal 124 is in the lowered position.

The pumping system 138 is coupled to a pumping port 126 formed in the chamber body 102. The pumping system 138 generally includes a throttle valve and one or more pumps arranged to control the pressure within the internal volume 104 of the processing chamber 100. Gases flowing from the internal volume 104 to the pumping port 126 may be routed through a pumping ring 142 to enhance gas flow uniformity across the surface of the substrate 122. One pumping ring which may be adapted to benefit from the invention is described in U.S. patent Ser. No. 10/911,208, filed Oct. 4, 2004, which is hereby incorporated by reference in its entirety.

The controller 146 is coupled to the various components of the processing chamber 100 to facilitate control of a silicon nitride deposition process as described below. The controller 146 generally includes a central processing unit (CPU) 150, a memory 148, and support circuits 152. The CPU 150 may be one of any form of computer processor that can be used in an industrial setting for controlling various chambers and sub processors. The memory 148, or computer readable medium, may be one or more of readily available memory, such as random access memories (RAM), read-only memory (ROM), floppy disk, hard drive, flash memory, or any other form of digital storage, local or remote. The support circuits 152 are coupled to the CPU 150 for supporting the processor in a conventional manner. These support circuits 152 include cache, power supplies, clock circuits, input/output circuitry and subsystems, and the like. A process, for example, a silicon-containing material deposition process 200 described below, is generally stored in the memory 148, typically as a software routine. The software routine may also be stored and/or executed by a second CPU (not shown) that is remotely located from the hardware being controlled by the CPU 150. Although the deposition process of the present invention is described as being implemented as a software routine, some of the method steps that are disclosed therein may be performed in hardware as well as by the software controller. As such, the invention may be implemented in software as executed upon a system computer, in hardware as an application specific integrated circuit or other type of hardware implementation, or a combination of software and hardware.

Figure 2:
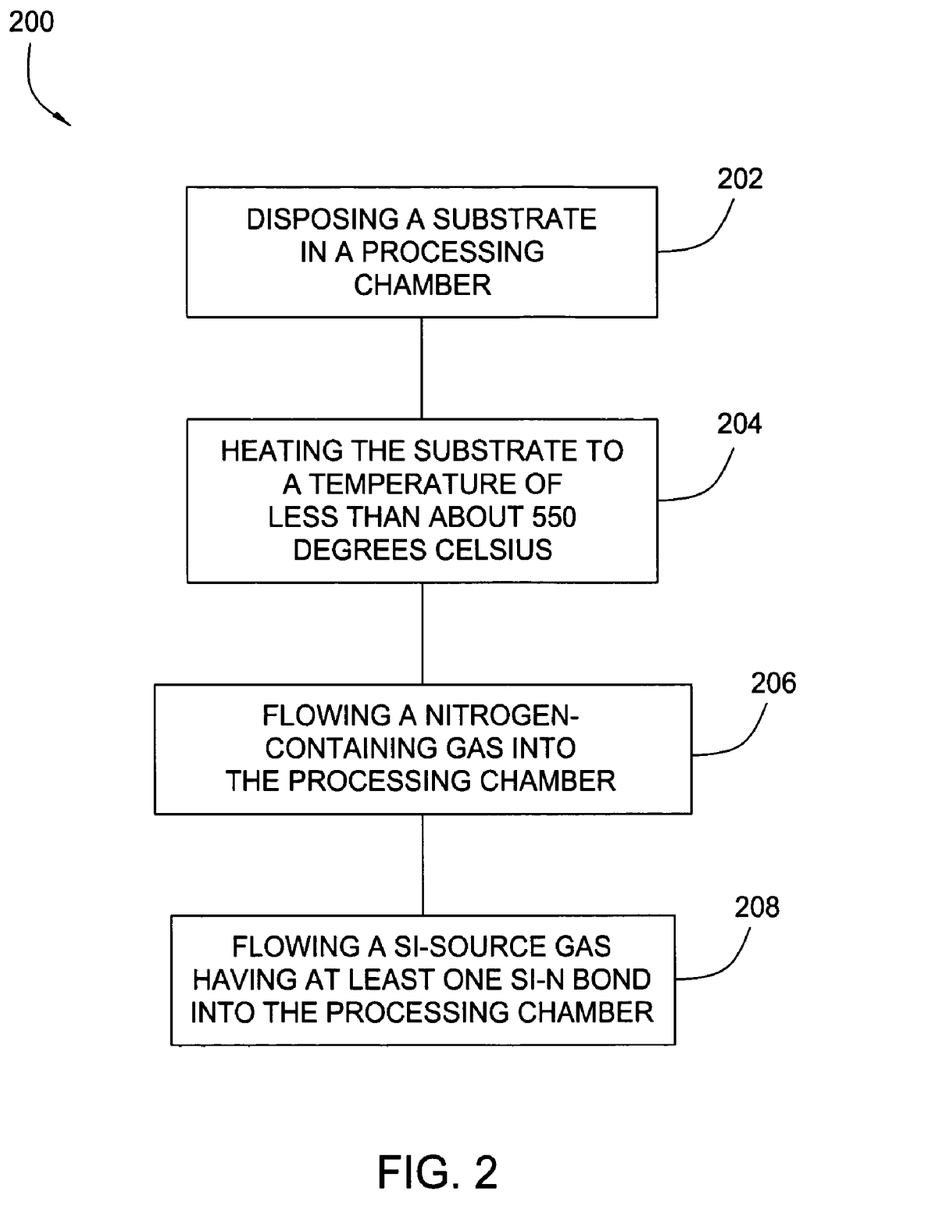
FIG. 2 is a flow diagram of one embodiment of a method of depositing a silicon nitride film.

FIG. 2 depicts one embodiment of a silicon-containing material deposition process 200, which may be performed in the processing chamber 100, or other suitable equipment. The method 200 begins at step 202 by placing the substrate 122 on the substrate support pedestal 124. The substrate 122 on which embodiments of the silicon nitride deposition process of the invention may be practiced include, but are not limited to, semiconductor wafers, such as crystalline silicon (e.g., Si<100> or Si<111>), silicon oxide, strained silicon, SOI, silicon germanium, and doped or undoped polysilicon. The substrate surface on which the silicon nitride layer is deposited may be bare silicon, a dielectric material, a conductive material, a barrier material, and the like. Optionally, the substrate 122 may be pretreated prior to the deposition of the silicon-containing material by polishing, etching, reduction, oxidation, halogenation, hydroxylation, annealing and/or baking.

At step 204, the substrate 122 is heated to a temperature less than about 650 degrees Celsius. In one embodiment, the substrate 122 is heated by applying power from the power source 116 to the resistive heating element (i.e., the heater 120) to heat the substrate 122 to a temperature between about 400 and about 650 degrees Celsius, and in yet another embodiment, the substrate 122 is heated to less than about 600 degrees Celsius.

At step 206, a flow of nitrogen-containing gas from the gas panel 136 is provided to the interior volume of the processing chamber 100 through the showerhead 144. The nitrogen-containing gas is generally provided from the gas panel 136 to the inlet 104.

Examples of suitable nitrogen-containing gases include, but are not limited to ammonia ($NH_3$), hydrazine $N_2H_4$), hydrogen azide $HN_3$, and combinations thereof. The nitrogen-containing gas ideally contains a nitrogen-nitrogen single bond (i.e., N—N single bond) for decomposition of the nitrogen source gas at low temperatures. Additionally, when a Si-source gas and a nitrogen-containing gas are used in the process gas mix, some amount of a nitrogen source gas may be included in the gas mix for additional control over the composition of the deposited layer during deposition. In one embodiment, the nitrogen-containing gas is $NH_3$.

At step 208, a flow of Si-source gas is provided to the interior volume 104 of the chamber body 102 through the showerhead 144 from the gas panel 136. Although one gas line 140 is shown disposed between the gas panel 136 and the inlet port 134, it is contemplated that the Si-source gas and the nitrogen-containing gas are provided to the processing chamber 100 in separate gas lines. It is also contemplated that the gas lines may be temperature controlled. It is further also contemplated that the nitrogen-containing gas in step 206 together with Si-source gas in step 208 can be introduced to inlet port 134 simultaneously, or in either step 206 or step 208, or step 206 can be ahead of step 208, and vice versa. Furthermore, step 206 and step 208 can be programmed in such way the chemical dosing time can be designed to ensure atomic layer coverage and enough purge between each step with desirable inert gases such as argon.

Si-source gases that can be used to produce a silicon nitride layer by thermal chemical vapor deposition at sufficiently high deposition rates at a low temperatures include compounds having one or more Si—N bonds or Si—Cl bonds, such as bis-tertbutylaminosilane (BTBAS) or hexachlorodisilane (HCD or $Si_2Cl_6$). While Cl is discussed herein, other halogens such as Fi, I, and others, can substitute Cl. Further inclusion of Si—Si bonds, N—N bonds, N=N bonds, a mixture of Si—N and Si—Cl bonds, or combinations thereof, in the precursor is may be beneficial in certain embodiments.

Combination of a Si—Cl functional group (bond) and a Si—N functional group (bond) has been observed to improved step coverage and microloading especially for the ever decreasing temperatures at suitable deposition rates. The number of Si—Cl groups can be varied relative to the number of Si—N groups. The Si—Cl and S—N bonds appear to have different effects on layer properties and deposition properties, and the ratio of Si—N to and S—Cl bonds can be used to balance layer properties and deposition properties.

Compounds having preferred bond structures described above have the generic structures:

(I) $NR_2$—Si($R'_2$)—Si($R'_2$)—$NR_2$, (amino(di)silanes),
(II) $R_3$—Si—N=N=N, (silyl azides), or
(III) $R'_3$—Si—NR—$NR_2$ (silyl hydrazines).

In the above generic structures, R and R' comprise one or more functional groups selected from the group of a halogen, an organic group having one or more double bonds, an organic group having one or more triple bonds, an aliphatic alkyl group, a cyclical alkyl group, an aromatic group, an organosilicon group, an alkyamino group, or a cyclic group containing N or Si, and combinations thereof.

Examples of suitable functional groups include chloro (Cl⁻), methyl (—$CH_3$), ethyl (—$CH_2CH_3$), isopropyl, trimethylsilyl, pyrrolidine, and combinations thereof. Examples of suitable compounds include:

| | |
|---|---|
| 2,-diethyl-tetrakis (diethylamino) disilane; | $(CH_2CH_3(NCH_2CH_3)_2Si)_2$ |

-continued

| | |
|---|---|
| 1,2-dichloro-tetrakis (diethylamino) disilane; | $(Cl(NCH_2CH_3)_2Si)_2$ |
| hexakis (N-pyrrolidinio) disilane; | $((C_4H_9N)_3)Si)_2$ |
| 1,1,2,2-tetrahydro-bis(di-trimethylamino) disilane; | $(Cl_2(NSi(CH_3)_3))Si)_2$ |
| 1,1,2,2-tetrachloro-bis(di-isopropyl) disilane; | $(Cl_2(N(C_3H_7)_2))Si)_2$ |
| 1,2-dimethyl-tetrakis (diethylamino) disilane; | $(CH_3(NCH_2CH_3)Si)_2$ |
| tris(dimethylamino)silane azide; | $(N(CH_3)_2)SiN_3$ |
| trimethylamino silane azide: | $(CH_3)SiN_3$ |
| (2,2 dimethylhydrazine)dimethylsilane and combinations thereof. | $(CH_3)_2SiH—NH—N(CH_3)_2$, |

It is believed that silicon source gas (precursor) or the silicon and nitrogen source gas (precursor) having a silicon to silicon single bond (i.e., Si—Si single bond) enables the molecule to decompose or disassociate at reduced temperatures, such as about 550° C. or less.

Other examples of suitable Si-source gases include silyl azides $R_3$—$SiN_3$ and silyl hydrazine class of precursors $R_3SiNR$—$NR_2$, linear and cyclic with any combination of R groups. The R groups may be H or any organic functional group such as methyl, ethyl, propyl, butyl, and the like ($C_XH_Y$). The R groups attached to Si can optionally be another amino group $NH_2$ or $NR_2$. One benefit of using this Si-source gas is that silicon and nitrogen are simultaneously delivered while avoiding the presence of chlorine to yield films with good step coverage and minimal pattern dependence (so-called pattern loading) without the undesirable ammonium chloride particle formation problematic to other conventions Si—N film precursors.

It is noted that an N—N bond also exists in hydrogen azide, hydrazine, and methyl hydrazine, and CVD deposition of SiN-containing films performed. However, addition of a separate Si-source is required for these latter precursors, and low temperature silicon sources such as disilane show poor step coverage and high pattern loading while hexachlorodisilane (HCD) is plagued with ammonium chloride particle issues. Noting that aminosilanes, such as BTBAS, show minimal pattern loading and good step coverage with no ammonium chloride concerns, the delivery of the intact Si—N unit appears to be a requisite. However, aminosilanes generally require processing temperatures well in excess 600 degrees Celsius to have acceptable deposition rates. The solution to meet all the requirements is to utilize a precursor that contains both of the critical features—the weak N—N bond and the aminosilane functionality Si—N— for low temperature decomposition.

Examples of specific silyl azides include trimethylsilylazide (available commercially from United Chemical Technologies, located in Bristol, Pa.) and tris-dimethylaminosilyl azide. Examples of specific silylhydrazines include $(CH_3)_2HSiNH$—$N)CH_3)_2$.

As the Si-source gas and the nitrogen-containing gas are combined in the substrate processing chamber 100, a silicon-containing material, such as a silicon nitride ($Si_3N_4$) film, is formed on the heated substrate 122. Despite the delivery of nitrogen from the Si-containing gas to the reaction zone within the interior volume, the Si-containing gas is mixed with the nitrogen-containing gas since the incorporation efficiencies for Si and N into the deposited SiN-containing film have different kinetic barriers. The deposited silicon-containing material exhibit good film qualities such as reflective index and wet etch rate, and deposition rates greater than 5 Å/min. In one embodiment, the silicon-containing film is deposited at a rate from about 10 Å/min to about 500 Å/min and is deposited to a thickness from about 10 Å to about 1,000 Å. The silicon-containing film formed as described above exhibits low hydrogen content and includes a small amount of carbon doping, which enhances boron retention in PMOS devices. In embodiments where a halogen-free Si-source gas is utilized, improved wet etch rate may be realized.

Stoichiometric silicon nitride films made utilizing the method 200 generally contain less than about 30 percent carbon (C) through potentially still greater than about 10 percent hydrogen (H) depending on temperature and choice of the R groups. Films deposited using the method 200 are additionally suitable for further post-processing treatments to lower the percent hydrogen, if desired. For example, hydrogen radicals may be introduced into the chamber utilized to reduce the hydrogen content of the deposited SiN-containing film. Hydrogen radicals may be produced using a remote plasma source, hot wire catalytic decomposition or other suitable method, One post-processing treatment is described in the previously incorporated U.S. patent application Ser. No. 10/741,417, filed Dec. 19, 2003 by S. Wang et al. Post-processing of films deposited using the method 200 may be optionally performed on any of the embodiments described herein.

A carrier gas may be provided at step 206 and/or step 208 to control the partial pressure of the nitrogen gas and/or the Si-source containing gas from a few mTorr to a few hundred Torr, and to control the total process pressure from about 1 Torr to about 760 Torr in single wafer chambers. In another embodiment, pressure in the processing chamber is between about 10 and 350 Torr. The carrier gas may be provided to control the partial pressure of the Si-source gas and/or the nitrogen and carbon containing gas from about 100 mTorr to about 1 Torr pressure in batch processing systems. Examples of suitable carrier gases include $N_2$, Ar and He, among others.

Optionally, an oxygen precursor may be added to the deposition method 200, typically at step 204 and/or step 206, to form silicon oxide or silicon oxynitride. Oxygen precursors that may be used in the deposition processes described herein include atomic oxygen, oxygen ($O_2$), ozone ($O_3$), $H_2O$, $H_2O_2$, organic peroxides, alcohols, $N_2O$, NO, $NO_2$, $N_2O_5$, derivatives thereof and combinations thereof. It is contemplated that use of carrier gases and/or oxygen precursors may be optionally performed on any of the embodiments described herein.

In another embodiment of the method 200, the Si-containing gas is an aminochlorodisilane class of precursors having a formula $(R_2N)_x$—$Si(CL)_{3-x}$—$Si(Cl)_{3-x}$—$(NR_2)_x$, wherein x is 1 or 2, and the R group may be any combination of organic alkyl groups such as methyl, ethyl, isopropyl, and the like. The Si-containing gas of this type is unique that it contains an N—Si—Si—N chain with the Si—Si bond being weak enough to permit facile thermal delivery of a Si—N unit for deposition of a Si—N containing film with deposition rates in excess of 40 Å/min and low activation energy.

The Si-containing gas, such as aminochlorodisilane class of precursors, is unique in that nitrogen is simultaneously delivered while still providing some necessary chlorine to yield films with good step coverage and minimal pattern dependence. The reduced chlorine in the precursor translates to substantial reduction in the undesirable ammonium chloride particle formation compared to other conventional SiN precursors.

Si-containing gas of the aminochlorodisilane class of precursors delivers lower carbon content into the deposited SiN film compared to alkylchlorodisilanes $R_x$—$Si(Cl)_{3-x}$—$Si(Cl)_{3-x}$—$R_x$, when no direct Si—C bond exists. The Si bonds are instead bonded in the form of the more important Si—N. While the N's, in turn, are bonded to C's, the N—C bond is weaker than the Si—C bond.

Two embodiments of a method 200 performed using aminochlorodisilanes as the Si-containing gas is described as follows. In a first embodiment performed in the processing chamber 100 described above, the method 200 includes heating the substrate 122 at step 202 to a temperature between about 400 and about 650 degrees Celsius, for example less than about 600 degrees Celsius. In another embodiment, the substrate is heated to less than about 500 degrees Celsius. A Si-source gas, for example, an aminochlorodisilane, is provided to the processing chamber 100 at step 204 at a rate between about 0.2 to about 1.0 grams/minute (g/m). In another example, the Si-source gas is provided at about 0.5 g/m. The spacing between the pedestal and showerhead is generally set to between about 500 to about 1000 mils. A nitrogen-containing gas, for example, $NH_3$, is provided to the processing chamber 100 at step 206 and combines with the Si-containing gas. The nitrogen-containing gas is delivered at a rate about 10 times greater than the rate of the Si-containing gas. For example, a ratio of $NH_3$ to Si-containing gas is in the range of about 1:100 to about 100:1. The chamber pressure is generally maintained in the range of about 10 to about 300 Torr, for example, between about 50 to about 100 Torr. Performance of this embodiment of the method 200 generally results in a SiN deposition rate of between about 60 to about 200 Å/min, for example, about 100 Å/min.

In a second embodiment of the method 200 suitable for depositing a SiN-containing film in a batch furnace, the method 200 includes heating the substrate 122 at step 202 to a temperature between about 400 and about 650 degrees Celsius, for example less than about 600 degrees Celsius. In another example, the substrate 122 is heated to less than about 500 degrees Celsius. The nitrogen-containing gas, such as $NH_3$, is provided to the processing chamber 100 at step 206 and combines with the Si-containing gas. The nitrogen-containing gas is delivered at a rate about 10 times less than the rate of the Si-containing gas, which is generally dependent on the furnace tube volume. For example, a ratio of $NH_3$ to Si-containing gas is in the range of about 5:1 to about 1:1. The furnace pressure is generally maintained in the range of about 0.1 to about 2.0 Torr, for example, between about 0.4 to about 1.0 Torr. Performance of this embodiment of the method 200 generally results in a SiN deposition rate of between about 5 to about 20 Å/min, for example, about 12 Å/min.

In another example of using other Si-containing gases to perform the method 200, a Si-containing gas comprised of 1,3,4,5,7,8-hexamethytetrasiliazane may be utilized to deposit a SiN-containing film. The 1,3,4,5,7,8-hexamethytetrasiliazane precursor is unique in that it contains alternating N—Si bond in a chain with each Si atom not fully terminated with a methyl group, thus leaving active Si—H bonds as well as two basic N—H groups that can react with Si—H (for example, other two N's are N-methyl groups). This structure permits the facile thermal delivery of Si—N units for deposition of a SiN-containing film with fast deposition rates in excess of about 40 Å/min with low activation energy.

In the above embodiments and examples, while Si-containing gas is described as being introduced first followed by N-containing gas, it should be appreciated that the sequence of introduction of the Si-containing gas and N-containing can be reversed for certain applications.

1,3,4,5,7,8-hexamethytetrasiliazane precursor falls in the general class of compounds called silazanes, which also have an alternating N—Si chain. Silazanes are commonly used in the manufacture of SiN ceramic components via high temperature pyrolysis (e.g., at temperatures in excess of 1000 degrees Celsius). Pyrolysis of silazanes at lower temperatures generally leaves at least about 20 percent carbon in the ceramic material (and typically about 50 percent in the by-product). Thus, silazanes are better known in the CVD community for the deposition of $Si_xC_yN_z$ films either at thermally high temperatures or using plasma enhancement.

Two unique aspects of this invention are the choice of 1,3,4,5,7,8-hexamethytetrasiliazane as the Si-containing gas and the addition of large amounts of $NH_3$. This combination results in both low carbon content for films deposited at high rates despite the low temperatures, e.g., at temperatures less than about 600 degrees Celsius. The compound 1,3,4,5,7,8 hexamethyltetrasilazane is unique in the silazane class in that each Si is not fully terminated with a methyl group, thus leaving active Si—H bonds as well as two basic nitrogens N—H that can react with Si—H (other two N's are N-methyl). Furthermore, lower C to Si/N ratios are present in this compound compared to the more common silazanes. The compound 1,3,4,5,7,8 hexamethyltetrasilazane is available commercially from United Chemical Technologies, located in Bristol, Pa.

SiN-containing materials are deposited utilizing the method 200 described above are used throughout electronic features/devices due to several physical properties. SiN-containing materials are electric insulators, as well as barrier materials. The barrier properties inhibit ion diffusion between dissimilar materials or elements when silicon-containing material is placed therebetween, such as a gate material and an electrode or between a low dielectric constant porous materials and copper. Therefore, SiN-containing materials may be used in barrier layers, protective layers, off-set layers, spacer layers and capping layers. Another physical property of silicon nitride materials is a high degree of hardness. In some applications, SiN-containing materials may be used as a protective coating for various optical devices as well as tools. Yet another physical property of silicon-containing material such as silicon nitride is etch selectivity to silicon oxide, i.e., silicon nitride can be used as etch stop layer under a silicon oxide dielectric layer to accurately control etch depth without over etching or under etching. Yet another physical property of silicon-nitrogen-containing materials contains carbon and hydrogen and carbon and hydrogen concentration can be used to tune film stress such as high tensile stress for desirable application.

Figure 3A:
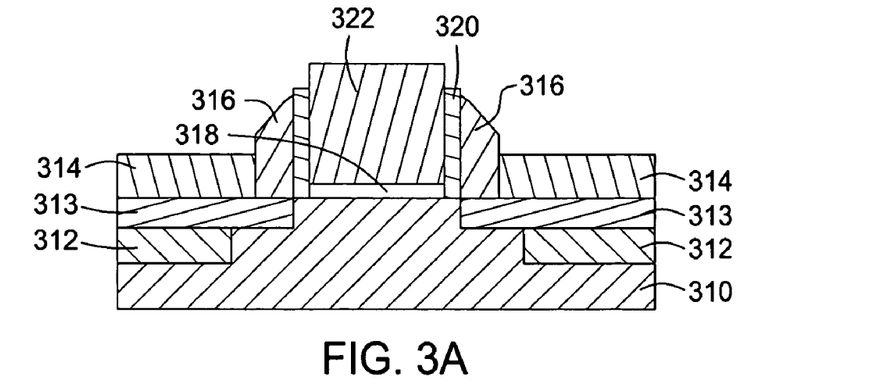
FIGS. 3A-B are cross sectional views of a MOSFET transistor having a silicon nitride layer at least partially deposited according to the method of FIG. 2.
Figure 3B:
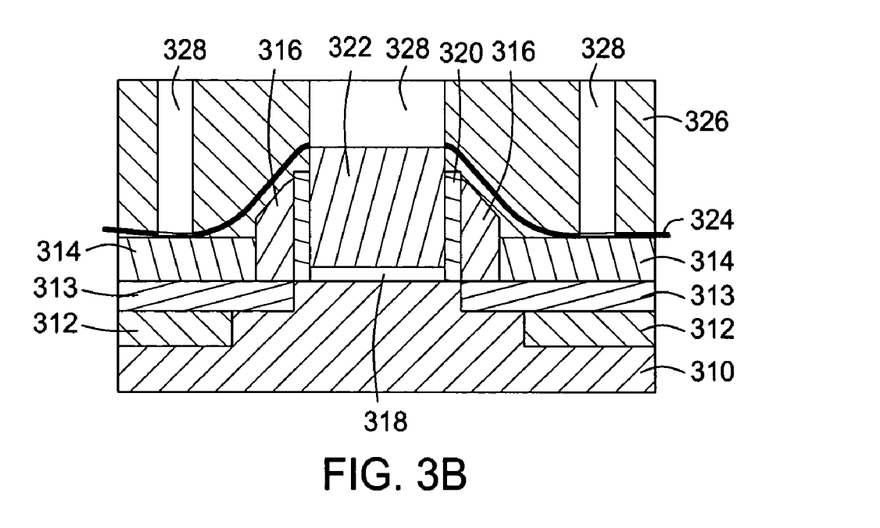
Figure 4:
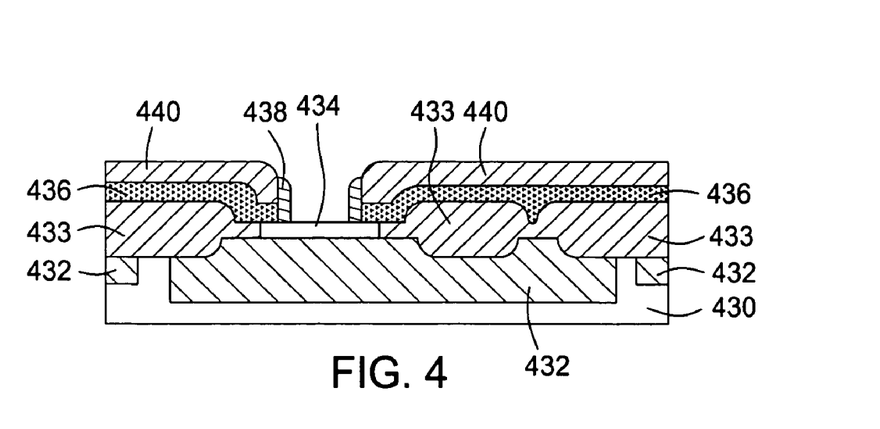
FIG. 4 is a cross section of an exemplary bi-polar transistor having a silicon nitride layer at least partially deposited utilizing the method of FIG. 2.

In some embodiments, silicon nitride materials may be deposited as various layers in MOSFET and bipolar transistors as depicted in FIGS. 3A-B and 4. For example, FIG. 3A shows silicon nitride materials deposited within a MOSFET containing both recessed and elevated source/drains. Source/drain layer 312 is formed by ion implantation of the substrate 310. Generally, the substrate 310 is doped n-type while the source/drain layer 312 is doped p-type material. Silicon-containing layer 313, usually Si, SiGe or SiGeC, is selectively and epitaxially grown on the source/drain layer 312 or directly on substrate 310 by CVD methods. Silicon-containing layer 314 is also selectively and epitaxially grown on the silicon-containing layer 313 by CVD methods. A gate barrier layer 318 bridges the segmented silicon-containing layer 313. Generally, gate barrier layer 318 may be composed of silicon oxide, silicon oxynitride or hafnium oxide. Partially encompassing the gate barrier layer 318 is a spacer 316, which is usually an isolation material such as a nitride/oxide/nitride stack (e.g., $Si_3N_4/SiO_2/Si_3N_4$). Alternatively, spacer 316 may be a homogeneous layer of a silicon nitride material, such as silicon nitride or silicon oxynitride deposited by the various methods described herein. Gate layer 322 (e.g., polysilicon) may have a spacer 316 and off-set layers 320 disposed on either side. Off-set layers 320 may be composed of a silicon nitride material, or silicon oxide material, deposited by the various processes described herein.

FIG. 3B shows etch stop layer 324 for source/drain and gate contact via etch deposited over a MOSFET. Etch stop layer 324 may be composed of a silicon nitride material, such as silicon nitride, deposited by the various methods described herein. A pre-metal dielectric layer 326 (e.g., silicon oxide) is deposited on etch stop layer 324 and contains contact hole vias 328 formed thereon.

In another embodiment, FIG. 4 depicts deposited silicon nitride material as several layers within a bipolar transistor during various embodiments of the invention. The silicon-containing compound layer 434 is deposited on an n-type collector layer 432 previously deposited on substrate 430. The transistor further includes isolation layer 433 (e.g., $SiO_2$, $SiO_xN_y$, or $Si_3N_4$), contact layer 436 (e.g., heavily doped poly-Si), off-set layer 438 (e.g., $Si_3N_4$), and a second isolation layer 440 (e.g., $SiO_2$, $SiO_xN_y$, or $Si_3N_4$). Isolation layers 433 and 440 and off-set layer 438 may be independently deposited as a silicon nitride material, such as silicon oxynitride, silicon carbon nitride, and/or silicon nitride deposited by the various processes described herein. In one embodiment, the isolation layers 433 and 440 are silicon oxynitride and off-set layer 338 is silicon nitride.

Thus, a method for depositing a silicon-containing layer, such as silicon nitride, has been provided. The method described above is suitable for device fabrication having small critical dimensions requiring low thermal budgets due to the use of deposition temperatures less than about 650 degrees Celsius, which advantageously facilitates robust circuit fabrication using sub 90 nm technology. Although the foregoing embodiments were described using temperatures below 650 degrees Celsius, it is contemplated that for some applications of the invention, the substrate and its circuits are resilient to higher temperatures. As such, the forgoing embodiments may find application in processes that use temperatures in excess of 650 degrees Celsius.

While the foregoing is directed to embodiments of the present invention, other and further embodiments of the invention may be devised without departing from the basic scope thereof, and the scope thereof is determined by the claims that follow.

What is claimed is:

1. A method for depositing a SiN-containing layer on a substrate, the method comprising:
   heating a substrate disposed in a processing chamber to a temperature less than about 650 degrees Celsius;
   flowing a silicon-containing gas into the processing chamber, wherein the silicon-containing gas is 1,3,4,5,7,8-hexamethytetrasiliazane;
   flowing a nitrogen-containing gas into the processing chamber; and
   depositing a SiN-containing layer on a substrate.

2. The method of claim 1, wherein the processing chamber is maintain between about 10 Torr to about 350 Torr.

3. The method of claim 1, wherein the nitrogen-containing gas is at least one of $NH_3$, $N_2H_4$ or $HN_3$.

4. The method of claim 1, wherein the nitrogen-containing gas is $NH_3$ provided at a ratio of $NH_3$ to silicon-containing gas in the range of about 1:100 to about 100:1.

5. The method of claim 1, wherein the nitrogen-containing gas is $NH_3$ provided at a ratio of $NH_3$ to silicon-containing gas in the range of about 5:1 to about 1:1.

6. The method of claim 1, wherein the substrate is maintained at a temperature less than about 500 degrees Celsius.

7. The method of claim 1, wherein the nitrogen-containing gas is $NH_3$ provided at a ratio of $NH_3$ to silicon-containing gas in the range of about 50:1 to about 100:1.

8. The method of claim 6, wherein the nitrogen-containing gas is $NH_3$ provided at a ratio of $NH_3$ to silicon-containing gas in the range of about 5:1 to about 1:1.

9. The method of claim 1, wherein the step of heating the substrate further comprises:

heating the substrate to a temperature between about 400 to about 500 degrees Celsius.

10. The method of claim 1 further comprising:

flowing an oxygen precursor into the processing chamber.

11. The method of claim 10, wherein the oxygen precursor is at least one of atomic-oxygen, oxygen ($O_2$), ozone ($O_3$), $H_2O$, $H_2O_2$, organic peroxides, alcohols, $N_2O$, $NO$, $NO_2$, $N_2O_5$ and derivatives thereof.

* * * * *